United States Patent
Wei

(10) Patent No.: US 7,345,524 B2
(45) Date of Patent: Mar. 18, 2008

(54) INTEGRATED CIRCUIT WITH LOW POWER CONSUMPTION AND HIGH OPERATION SPEED

(75) Inventor: Hon-Suo Wei, Baoshan Township, Hsinchu County (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 308 days.

(21) Appl. No.: 11/069,141

(22) Filed: Mar. 1, 2005

(65) Prior Publication Data

US 2006/0197464 A1    Sep. 7, 2006

(51) Int. Cl.
*H03K 17/72* (2006.01)
(52) U.S. Cl. ............. 327/442; 327/396; 327/544; 257/499; 257/500
(58) Field of Classification Search ........ 327/534–538, 327/389, 396, 401, 442, 544–546; 323/282, 323/283; 257/390–392, 499, 500
See application file for complete search history.

(56) References Cited

U.S. PATENT DOCUMENTS

| | | | |
|---|---|---|---|
| 5,844,853 A * | 12/1998 | Kitsukawa et al. ......... 365/226 |
| 6,380,798 B1 * | 4/2002 | Mizuno et al. ............. 327/534 |
| 6,483,165 B2 * | 11/2002 | Ooishi et al. .............. 257/499 |
| 6,737,844 B2 | 5/2004 | Trivedi et al. |
| 6,900,690 B2 * | 5/2005 | Kang et al. ................. 327/544 |

OTHER PUBLICATIONS

Mircea R. Stan, "Low Threshold CMOS Circuits with Low Standby Current," University of VA, Electrical Engineering Dept., Charlottesville, VA 22903, pp. 97-99, 1998.

\* cited by examiner

*Primary Examiner*—Haissa Philogene
(74) *Attorney, Agent, or Firm*—Duane Morris LLP

(57) ABSTRACT

An integrated circuit includes a functional circuit module operating at a voltage range between a first voltage level and a second voltage level lower than the first voltage level. A power supply switch module, coupled between the functional circuit module and one or more power supplies, is controlled by one or more controlling biases of voltage levels outside the voltage range between the first and second voltage levels for more fully turning on and off the power supply switch module than biases that are within the range between the first and second voltage levels do.

13 Claims, 2 Drawing Sheets

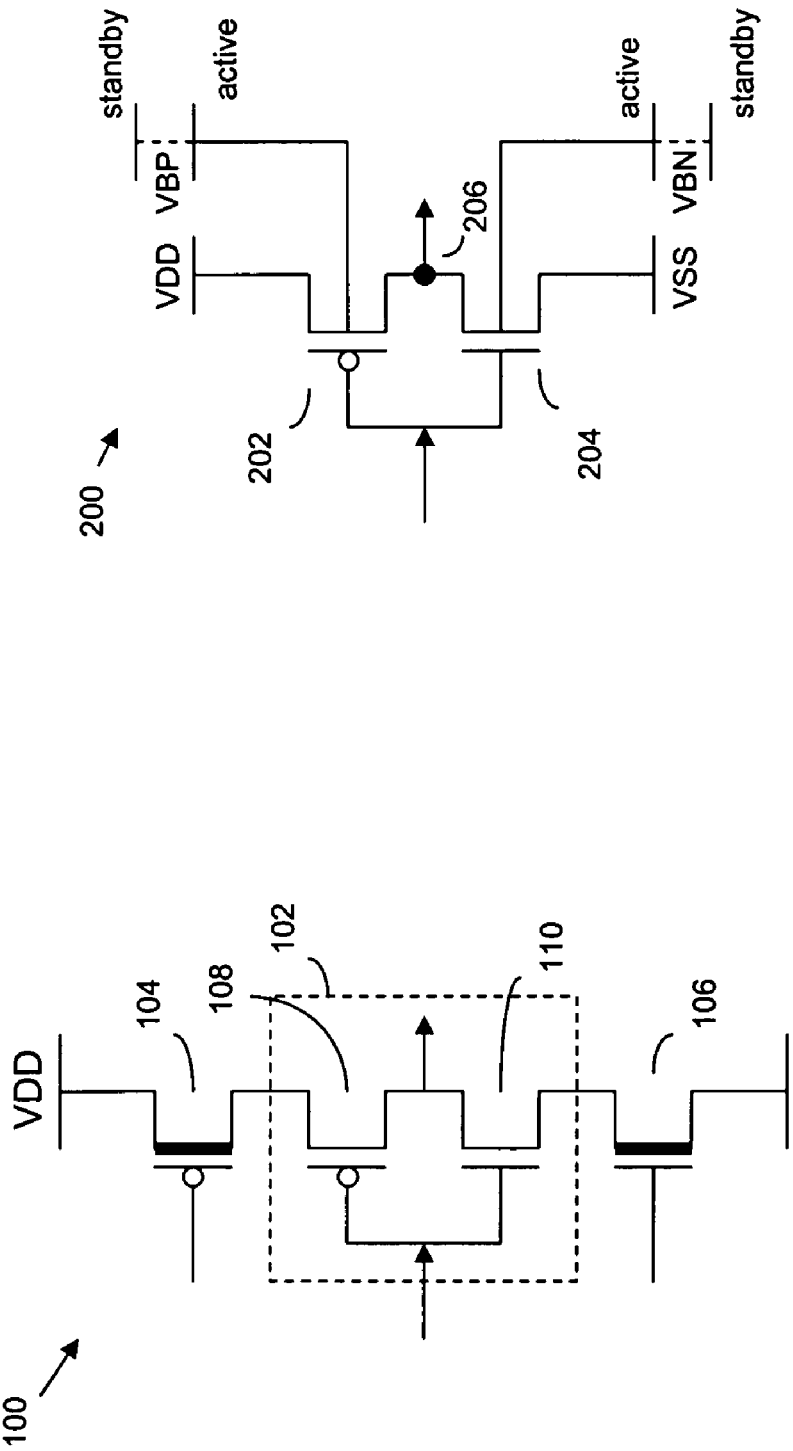

INTEGRATED CIRCUIT WITH LOW POWER CONSUMPTION AND HIGH OPERATION SPEED

BACKGROUND

The present invention relates generally to semiconductor circuit designs, and more particularly to integrated circuits with a high operation speed and low power consumption.

As integrated circuit designs become more complicated, their power consumption has become a major design concern. Most of today's integrated circuits incorporate some sorts of power saving techniques for reasons, such as cost efficiency. Power saving techniques include, for example, disabling peripheral devices, standby mode designs and many other methods. High power consumption exacerbates reliability problems by raising the operating temperature of an integrated circuit. It also intensifies the current flow in a power supply line, thereby causing electro-migration problems. In addition, since the power dissipated by an integrated circuit is directly proportional to the square of the power supply voltage, high power consumption exponentially impacts battery-powered portable devices by requiring either a large battery pack or an unacceptably short operating time.

As such, there have been many efforts to reduce the power consumption of an integrated circuit. For example, the power supply voltage can be reduced from a higher voltage level, such as 5V, to a lower voltage level, such as 3.3V and below. As another example, an integrated circuit can be implemented with a standby scheme, which cuts off the power supply to certain circuit modules in the integrated circuit when it idles for a predetermined period of time.

While the standby scheme is useful in reducing the power consumption of an integrated circuit, it certainly can be further improved. For example, a leakage current still occurs, when the power supply is not fully cut off to the circuit modules. Various conventional methods are used to avoid such current leakage. One method is to use devices of multiple threshold voltages. The high threshold voltage devices are used as switches between power supplies and circuit modules, since they can be more fully turned off than the low threshold voltage devices. This helps to reduce the leakage current from the power supplies to the circuit modules.

There are many ways to implement the multiple threshold voltage devices by, for example, varying the gate oxide thickness, doping densities or channel lengths. However, this requires separate sets of masks and process steps to form the devices of various threshold voltages. As a result, it incurs additional fabrication costs. It is possible to realize multiple threshold voltages for devices of the same physical dimensions and properties by modulating the biases applied to their bodies. However, these devices have a slower operation speed, due to the time needed to charge their bodies and wells.

What is needed is an integrated circuit with a low power consumption and high operation speed.

SUMMARY

The invention discloses an integrated circuit of a standard logic process, with a high operation speed and low power consumption. In one embodiment, the integrated circuit includes a functional circuit module operating at a voltage range between a first voltage level and a second voltage level lower than the first voltage level. A power supply switch module, coupled between the functional circuit module and one or more power supplies, is controlled by one or more controlling biases of voltage levels outside the voltage range between the first and second voltage levels for more fully turning on and off the power supply switch module than biases that are within the range between the first and second voltage levels do.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 illustrates a schematic view of a conventional integrated circuit using devices of various threshold voltages for avoiding a leakage current.

FIG. 2 illustrates a schematic view of a conventional integrated circuit using devices whose bodies are modulated by various biases for avoiding a leakage current.

DESCRIPTION

Figure 3:
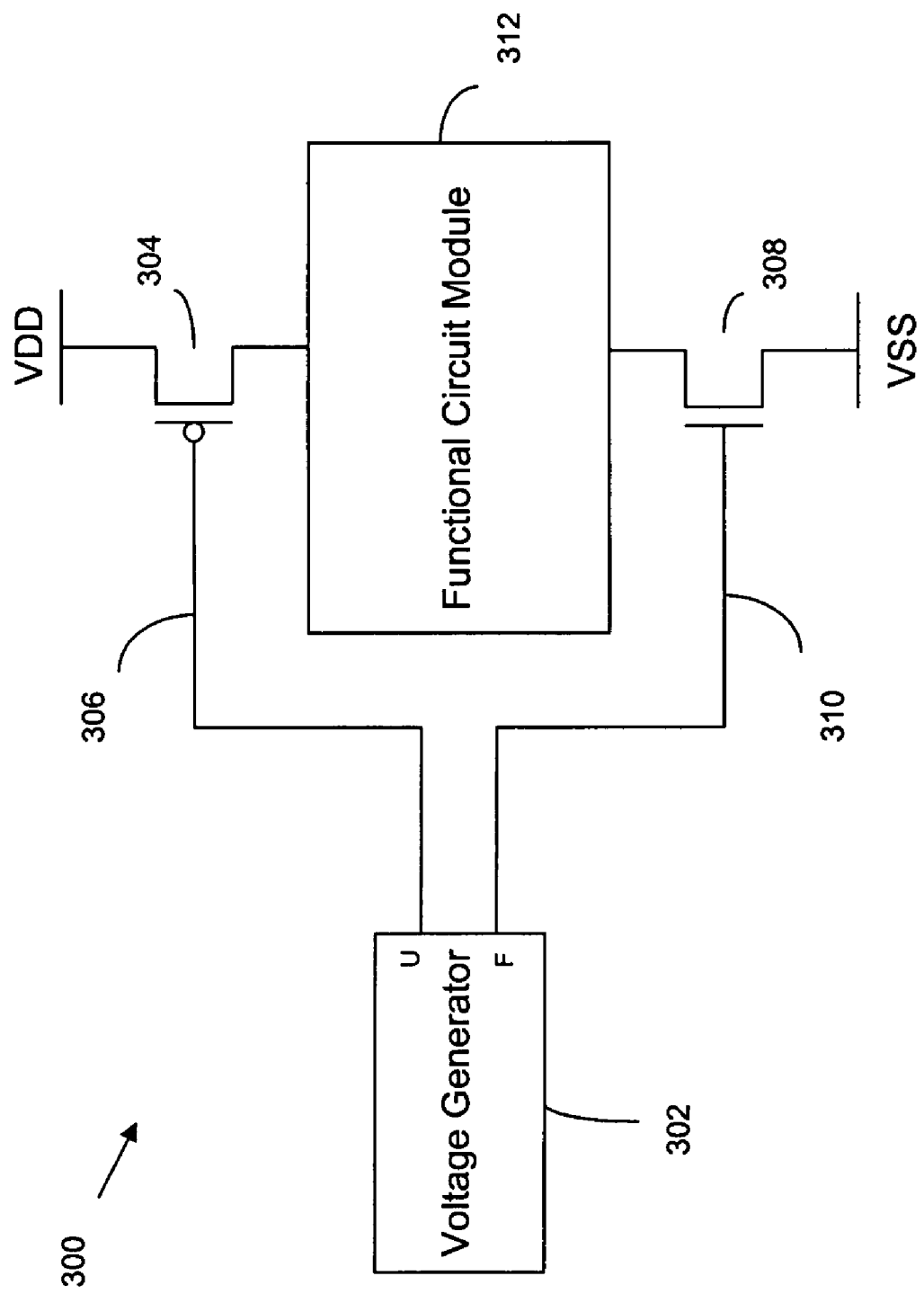
FIG. 3 illustrates a schematic view of an integrated circuit with a high operation speed and low power consumption, in accordance with one embodiment of the present invention.

FIG. 1 illustrates a schematic view of a conventional integrated circuit 100 using devices of various threshold voltages for avoiding a leakage current. The integrated circuit 100 includes a functional circuit module 102 coupled to a first power supply of a first voltage level VDD through a PMOS transistor 104, and a second power supply of a second voltage level VSS through an NMOS transistor 106. The first voltage level VDD is higher than the second voltage level VSS. The functional circuit module 102 is composed, for example, of a PMOS transistor 108 and an NMOS transistor 110. The PMOS and NMOS transistors 104 and 106 have a higher threshold voltage than that of the PMOS and NMOS transistors 108 and 110.

The integrated circuit 100 operates in an active mode and standby mode. In the active mode, the PMOS and NMOS transistors 104 and 106 are turned on to allow the functional circuit module 102 being powered by the power supplies. The PMOS and NMOS transistors 108 and 110 have a lower threshold voltage as opposed to the PMOS and NMOS transistors 104 and 106, so that they can be switched on and off faster. This helps the functional circuit module 102 to operate at a high speed. In the standby mode, the PMOS and NMOS transistors 104 and 106 are turned off to save the electrical power. Since they are high threshold voltage devices, they can be more fully turned off, thereby reducing the current leakage from the power supplies to the functional circuit module 102.

A shortcoming of the conventional circuit design is the additional costs of fabricating the devices of various threshold voltages. As discussed in the background, such devices may be made by varying their gate oxide thickness, doping densities or channel lengths. They require separate sets of masks or processing steps. This increases the fabrication costs.

FIG. 2 illustrates a schematic view of a conventional integrated circuit 200 using devices whose bodies are modulated by various biases for avoiding a leakage current. A PMOS transistor 202 is coupled between a node 206 and a first power supply of a first voltage level VDD. An NMOS transistor 204 is coupled between the node 206 and a second power supply of a second voltage level VSS. The first voltage level VDD is higher than the second voltage level VSS.

In the standby mode, the body of the PMOS transistor 202 is biased by a potential VBP higher than VDD, and the body of the NMOS transistor 204 is biased by a potential VBN lower than VSS. The biases imposed increase the threshold voltages for both the PMOS and NMOS transistors 202 and 204. As a result, the transistors can be more fully turned off, thereby avoiding a leakage current.

Due to the capacitance of the P-well of the NMOS transistor 204 and the N-well of the PMOS transistor 202, it takes a time delay to fully raise the threshold voltages of the transistors after the potentials VBP and VBN applied. As such, the integrated circuit 200 has a drawback of a lower operation speed.

FIG. 3 illustrates a schematic view of an integrated circuit 300 with a high operation speed and low power consumption, in accordance with one embodiment of the present invention. The integrated circuit 300 includes a functional circuit module 312 operating at a voltage range between a first voltage level VDD and a second voltage level VSS that is lower than VDD. The functional circuit module 302 can be a memory block, logic circuit, flip-flop, processor or any circuit module implemented with the standby scheme. The functional circuit module 312 is coupled to a first power supply VDD through a PMOS transistor 304, and to a second power supply VSS through an NMOS transistor 308. The source of the PMOS transistor 304 is connected to VDD, while its drain is connected to the functional circuit module 312. For the NMOS transistor 308, its source is connected to VSS, while its drain is connected to the functional circuit module 312.

The PMOS and NMOS transistors 304 and 308 collectively operate as a power supply switch module controlled by one or more controlling biases generated from a voltage generator 302. The controlling biases are set to have voltage levels outside the voltage range between VDD and VSS for more fully turning on and off the power supply switch module than a bias that is within the range does. The voltage generator 302 sends an "upper" signal to the gate of the PMOS transistor 304 through an output "U" and an upper wire 306, and a "footer" signal to the gate of the NMOS transistor 308 through an output "F" and a footer wire 310.

In the standby mode, the voltage generator 302 applies a controlling bias that is greater than VDD to the gate of the PMSO transistor 304 through the upper wire 306. This high potential bias overly saturates the gate to more fully avoid any leakage current flowing from the source to the drain of the PMOS transistor 304. Similarly, the voltage generator 302 applies a controlling bias lower than VSS to the gate of the NMOS transistor 308 through the footer wire 310. These voltages fully turn off the transistors 304 and 308 and fully put the functional circuit module 312 into the standby mode. As a result, a complete turn off of the transistors 304 and 308 is possible, thereby significantly reducing or eliminating a leakage current.

To switch from the standby mode to the active mode, the voltage generator 302 switches the controlling biases imposed on the upper wire 306 and the footer wire 310. This time the voltage generator 302 applies a controlling bias lower than VSS to the gate of the PMOS transistor 304 through the upper wire 306. Similarly, the voltage generator 302 applies a controlling bias greater than VDD to the gate the NMOS transistor 308 through the footer wire 310. The combining effect completely turns on both transistors 304 and 308, with the functional circuit module 312 taking a full swing of VDD and VSS. As such, the functional circuit module 312 can operate at a faster speed as opposed to an integrated circuit, in which the controlling biases are within the range between VDD and VSS.

The voltage generator 302 may include a charge pump or a voltage booster. An example of a charge pump could be a generator that uses capacitors instead of inductors to store and transfer energy. Voltage boosters are different than charge pumps in that they boost the voltage once it has reached a certain level. For example, it is required to have 5 volts to drive a device, but a power supply only applies about 3 volts. A voltage booster may then be used to increase the voltage level to 5 volts.

This invention proposes a novel design in order to reduce the leakage current in high-speed, low-power integrated circuits. One advantage of the proposed integrated circuit design is the saved fabrication costs. The proposed integrated circuit does not require devices of various threshold voltages. Thus, all of the devices, including those in the functional circuit module and the power supply switch module, can be made with the same set of masks and in the same series of processing steps. Another advantage of the proposed integrated circuit is its relatively fast operation speed. No body bias modulation scheme is used, so that no time delay due to switching the body between various voltage levels is involved. Moreover, since the controlling bias is outside the voltage range between VDD and VSS, the power supply switch module can be more fully turned on. This also helps to improve the operation speed of the functional circuit module.

It is noteworthy that while the embodiment as illustrated in FIG. 3 includes two transistors 304 and 308, the disclosed invention can be embodied by one transistor coupled between a power supply and the functional circuit module 312. The controlling bias applied on the gate of that transistor is outside the voltage range between VDD and VSS. Depending on the type of the transistor chosen, a bias higher than VDD or lower than VSS can be used to full set the functional circuit module in the active mode or standby mode.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An integrated circuit comprising:
   a functional circuit module operating at a voltage range between a first voltage level and a second voltage level lower than the first voltage level;
   a plurality of power supply switch modules, each coupled between the functional circuit module and a corresponding power supply, controlled by a corresponding controlling bias outside the voltage range between the first and second voltage levels for more fully turning on and off the power supply switch module than biases that are within the range between the first and second voltage levels do; and a single voltage generator that provides a first controlling bias to one of the power supply modules and a second controlling bias to another of the power supply modules when the functional circuit module is in active mode and switches the first and second controlling biases when the functional circuit module is in standby mode, the first controlling bias differing from the second controlling bias.

2. The integrated circuit of claim 1 wherein the power supply switch module comprises a PMOS transistor coupled between the functional circuit module and a first power supply of the first voltage level.

3. The integrated circuit of claim 2 wherein the PMOS transistor is turned on by the controlling bias that is lower than the second voltage level, when the functional circuit module is in an active mode.

4. The integrated circuit of claim 2 wherein the PMOS transistor is turned off by the controlling bias that is higher than the first voltage level, when the functional circuit module is in a standby mode.

5. The integrated circuit of claim 1 wherein the power supply switch module comprises an NMOS transistor coupled between the functional circuit module and a second power supply of the second voltage level.

6. The integrated circuit of claim 5 wherein the NMOS transistor is turned on by the controlling bias that is higher than the first voltage level, when the functional circuit module is in an active mode.

7. The integrated circuit of claim 5 wherein the NMOS transistor is turned off by the controlling bias that is lower than the second voltage level, when the functional circuit module is in a standby mode.

8. A method for reducing a current leakage and improving an operation speed of an integrated circuit, which comprises a functional circuit module operating at a voltage range between a first voltage level and a second voltage level lower than the first voltage level, a PMOS transistor coupled between the functional circuit module and a first power supply of the first voltage level, and an NMOS transistor coupled between the functional circuit module and a second power supply of the second power level, the method comprising:

providing a voltage generator;

the voltage generator generating a first controlling bias higher than the first voltage level and a second controlling bias lower than the second voltage level;

the voltage generator applying the first bias to a gate of the PMOS transistor and the second bias to a gate of the NMOS transistor, when the functional circuit module is in a standby mode; and the voltage generator switching and thereby applying the second bias to a gate of the PMOS transistor and the first bias to a gate of the NMOS transistor thereby switching the functional circuit module to an active mode, whereby the first and second biases more fully turn on and off the PMOS and NMOS transistors than biases that are within the range between the first and second voltage levels do.

9. An integrated circuit with a reduced current leakage and improved operation speed, comprising:

a functional circuit module operating at a voltage range between a first voltage level and a second voltage level lower than the first voltage level;

a PMOS transistor coupled between the functional circuit module and a first power supply of the first voltage level, and controlled by a first controlling bias;

an NMOS transistor coupled between the functional circuit module and a second power supply of the second voltage level, and controlled by a second controlling bias; and a single voltage generator coupled to both the PMOS and NMOS transistors, for simultaneously generating the first and second controlling biases outside the voltage range between the first and second voltage levels to more fully turn on and off the PMOS and NMOS transistors than biases that are within the range between the first and second voltage levels do, the first controlling bias and second controlling bias being unequal and the voltage generator capable of switching between providing the first controlling bias to the PMOS transistor and the second controlling bias to the NMOS transistor, and providing the first controlling bias to the NMOS transistor and the second controlling bias to the PMOS transistor.

10. The integrated circuit of claim 9 wherein the PMOS transistor is turned on by the first controlling bias that is lower than the second voltage level, when the functional circuit module is in an active mode.

11. The integrated circuit of claim 9 wherein the PMOS transistor is turned off by the first controlling bias that is higher than the first voltage level, when the functional circuit module is in a standby mode.

12. The integrated circuit of claim 9 wherein the NMOS transistor is turned on by the second controlling bias that is higher than the first voltage level, when the functional circuit module is in an active mode.

13. The integrated circuit of claim 9 wherein the NMOS transistor is turned off by the second controlling bias that is lower than the second voltage level, when the functional circuit module is in a standby mode.

* * * * *